United States Patent [19]

Banno et al.

[11] Patent Number: 5,259,099
[45] Date of Patent: Nov. 9, 1993

[54] METHOD FOR MANUFACTURING LOW NOISE PIEZOELECTRIC TRANSDUCER

[75] Inventors: Hisao Banno; Kohji Ogura, both of Nagoya, Japan

[73] Assignee: NGK Spark Plug Co., Ltd., Aichi, Japan

[21] Appl. No.: 878,179

[22] Filed: May 4, 1992

Related U.S. Application Data

[62] Division of Ser. No. 797,440, Nov. 22, 1991.

[30] Foreign Application Priority Data

Nov. 30, 1990 [JP] Japan .................. 2-337795
Mar. 8, 1991 [JP] Japan .................... 3-69133

[51] Int. Cl.$^5$ ............................. H01L 41/22
[52] U.S. Cl. .................. 29/25.35; 310/359; 310/800
[58] Field of Search ........... 29/25.35; 310/357–359, 310/800, 334–337

[56] References Cited

U.S. PATENT DOCUMENTS 4,841,494 6/1989 Banno ................ 310/337 X

*Primary Examiner*—Carl E. Hall
*Attorney, Agent, or Firm*—Darby & Darby

[57] ABSTRACT

A high unidirectivity piezoelectric element whose $d_{31}$, $d_{33}$ or $d_h$ is substantially zero. The element may be in the form of a sheet or a cable and includes a pair of electrodes, and a piezoelectric layer interposed between the pair of electrodes and containing two, first and second inorganic piezoelectric materials which have different coercive forces from each other and which are polarized in opposite directions. The element may be obtained by first applying a direct current voltage to a layer containing the first and second piezoelectric materials to polarize the both piezoelectric materials in one direction, and then applying a reverse direct current voltage thereto so that one of the piezoelectric materials having a smaller coercive force is selectively polarized in the other direction.

15 Claims, 15 Drawing Sheets

METHOD FOR MANUFACTURING LOW NOISE PIEZOELECTRIC TRANSDUCER

This application is a division of application Ser. No. 07/797,440, filed Nov. 22, 1991, which is assigned to the same assignee.

BACKGROUND OF THE INVENTION

This invention relates to a piezoelectric element and to a process for preparing same.

Piezoelectric elements including a piezoelectric layer interposed between a pair of electrodes are now used in a variety of fields. One known piezoelectric layer consists of an inorganic piezoelectric material such as barium titanate or lead titanate zirconate. In spite of its high piezoelectric constant, a piezoelectric element using this type of piezoelectric layer cannot be applied to various utilizations because of the brittleness of the layer. A piezoelectric layer using an organic piezoelectric material such as poly(vinylidene fluoride), poly(vinyl fluoride), poly(vinylidene chloride), poly(vinyl chloride) or nylon is also known. While this layer can be shaped in various desired forms such as films because of its flexibility, the piezoelectric constant thereof is lower than that of the above-mentioned piezoelectric layer of an inorganic piezoelectric material.

A composite piezoelectric layer composed of an organic matrix in which an inorganic piezoelectric material is dispersed is known. As the matrix, the above-mentioned organic piezoelectric materials or other synthetic polymeric materials such as fluoro-rubbers, chloroprene rubbers, silicone rubbers, fluorocarbon resins and epoxy resins are generally used. Since such a composite piezoelectric layer has both a high piezoelectric constant and a high flexibility, piezoelectric element using the composite layer is applied to a wide variety of utilizations such as speakers, buzzers, microphones, key boards, pressure-sensitive switches and flaw detectors. Further, since the composite piezoelectric layer has an acoustic impedance as low as a liquid or a living body, piezoelectric elements using such a layer are applicable to hydrophones or ultrasonic detecting probes for living bodies.

Known piezoelectric elements have been produced by impressing a direct current voltage between a pair of electrodes between which a matrix layer containing an inorganic piezoelectric material is interposed, so that the inorganic piezoelectric material is polarized in one direction.

For increasing piezoelectric constants $d_{31}$, $d_{33}$ and $d_h$ of the piezoelectric elements, various attempts have been made such as by using a specific piezoelectric material such as of a lead titanate zirconate-series, by increasing the content of the piezoelectric material in the matrix and by increasing the impression voltage for polarization of the piezoelectric material.

In the conventional piezoelectric elements using the above composite piezoelectric layer, when the strain in the direction of $d_{33}$ (strain in the direction parallel with the electrical field) is increased, the strain in the direction $d_{31}$ (strain in the direction perpendicular to the electrical field) is also increased as a result of a lateral-longitudinal coupling. This is advantageous for some sort of piezoelectric elements but disadvantageous for unidirectivity ultrasonic detecting probes in which ultrasonic waves are emanated or received in only one direction, for hydrophones in which the figure-of-merit is represented by underwater wave receiving sensitivity $d_h$ ($=d_{33}+2d_{31}$) or for devices which are towed by marine vessels and in which noises are generated during tow.

More particularly, when a composite piezoelectric sheet containing an epoxy resin matrix and lead titanate zirconate powder dispersed in the matrix with a volume ratio of the powder to the matrix of 60:40 is sandwiched between a pair of electrodes and when a direct current voltage of 70 KV/cm is impressed between the electrodes, the resulting piezoelectric element has $d_{33}$ of $104 \times 10^{-12}$ C/N and $d_{31}$ of $-45.5 \times 10^{-12}$ C/N. When this piezoelectric element is used in air, the wave receiving sensitivity is represented by $d_{33}$. When the element used under water such as in the case of a hydrophone, a static water pressure is applied in all directions so that the wave-receiving sensitivity is represented by $d_h$ ($=d_{33}+2d_{31}$). Namely, the sensitivity $d_h$ is $13 \times 10^{-12}$ C/N which is about one eighth of $d_{33}$. Thus, in the case of hydrophones, $d_{31}$ poses a problem of reduction of $d_h$ due to the negative contribution thereof. Similarly, when such a piezoelectric element is used for towing by a vessel, noise signals are unavoidably generated due to the strain in the direction of $d_{31}$. These signals are amplified by positive signals caused by the strains in the direction of $d_{33}$ so that the S/N ratio is lowered.

Further, when the above piezoelectric element is used as an ultrasonic detector probe, in which a high unidirectivity in the direction perpendicular ($d_{33}$ direction) to or parallel ($d_{31}$ direction) with the electrodes is desired in generating or receiving ultrasonic wave in either $d_{31}$ or $d_{33}$ direction, $d_{31}$ and $d_{33}$ of the piezoelectric element are not compatible with each other with respect to the unidirectivity.

SUMMARY OF THE INVENTION

It is, therefore, an object of the present invention to provide a piezoelectric element, one of the piezoelectric constants $d_{33}$, $d_{31}$ and $d_h$ of which is substantially zero.

Another object of the present invention is to provide a piezoelectric element of the above-mentioned type which is useful as a hydrophone or the like utilization and which has an improved unidirectivity, an improved sensitivity or a small S/N ratio.

it is a further object of the present invention to provide a process which can easily prepare the above piezoelectric element.

In accomplishing the foregoing object, the present invention provides a piezoelectric element which includes a pair of electrodes, and a piezoelectric layer interposed between the pair of electrodes and containing two, first and second inorganic piezoelectric materials which have different coercive forces from each other and which are polarized so that one of $d_{31}$, $d_{33}$ and $d_h$ of the piezoelectric element is substantially zero.

The present invention also provides a process for producing a piezoelectric element, which includes the steps of:

providing a pair of electrodes between which a piezoelectric layer containing two, first and second inorganic piezoelectric materials having different coercive forces from each other is disposed;

impressing a first, direct current voltage between the pair of electrodes to polarize the first and second inorganic piezoelectric materials in one direction; and then impressing a second, direct current voltage between the pair of electrodes to polarize one of the first and second inorganic piezoelectric materials, whose coercive force is smaller than that of the other one of the first and second inorganic piezoelectric materials, in the other direction, so that one of $d_{31}$, $d_{33}$ and $d_h$ of the piezoelectric element is substantially zero.

The present invention uses two different kinds of inorganic piezoelectric materials in combination for forming a piezoelectric layer to be interposed between a pair of electrodes. The two different piezoelectric materials are polarized in opposite directions to each other so that their piezoelectric behaviors are also opposite to each other. Thus, it is possible to make one of $d_{31}$, $d_{33}$ and $d_h$ of the piezoelectric element substantially zero.

One of the inorganic piezoelectric materials has a large coercive force and a large anisotropy in piezoelectric constants ($d_{33}/d_{31}$) and may be, for example, $PbTiO_3$, $PbNb_2O_6$ or $PbTa_2O_6$. Such a piezoelectric materials (which will be hereinafter referred to as a first inorganic piezoelectric material) can be polarized when subjected to a direct current electrical field of 50 KV/cm or more. The other inorganic piezoelectric material has a small coercive force and a small anisotropy in piezoelectric constants ($d_{33}/d_{31}$) and may be, for example, $BaTiO_3$ or $PbTi_xZr_{1-x}O_3$ where x is a number of greater than 0 but not greater than 1. The latter type of piezoelectric material (which will be hereinafter referred to as a second inorganic piezoelectric material) can be easily polarized when subjected to a direct current electrical field of 40 KV/cm or less.

BRIEF DESCRIPTION OF THE DRAWINGS

Other objects, features and advantages of the present invention will become apparent from the detailed description of the preferred embodiments of the invention which follows, when considered in light of the accompanying drawings, in which.

DETAILED DESCRIPTION OF THE PREFERRED EMBODIMENTS OF THE INVENTION

The piezoelectric element according to the present invention may be in the form of a sheet, wherein a piezoelectric layer containing two different, first and second inorganic piezoelectric materials is disposed between a pair of parallel electrode plates. The piezoelectric layer may be formed only of the two piezoelectric materials or may include an organic or inorganic matrix in which the two inorganic piezoelectric materials are contained. The matrix may be formed of a material conventionally used for forming composite piezoelectric bodies, such as the polymeric materials mentioned previously. As an inorganic matrix, there may be used a low melting point glass or a low temperature-sintered ceramic.

The piezoelectric element according to the present invention may be embodied in various constructions.

Figure 1:
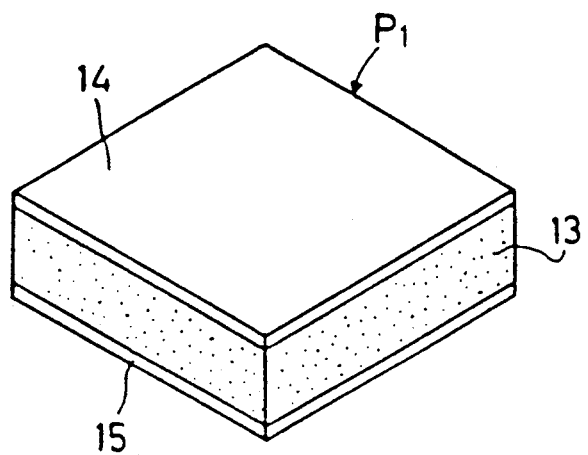
FIGS. 1(a), 2(a), 3(a), 4(a), 5(a), 6(a), 7(a), 8(a), 9(a) and 10(a) are perspective views schematically illustrating preferred embodiments of piezoelectric elements according to the present invention.
FIGS. 1(b), 2(b), 3(b), 4(b), 5(b), 6(b), 7(b), 8(b), 9(b) and 10(b) are schematic, elevational, cross-sectional views of FIGS. 1(a), 2(a), 3(a), 4(a), 5(a), 6(a), 7(a), 8(a), 9(a) and 10(a), respectively.
Figure 1:
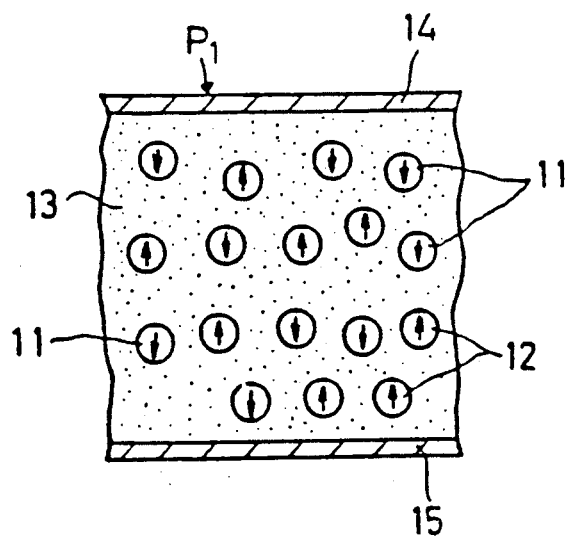

Referring now to the accompanying drawings and first to FIGS. 1(a) and 1(b), designated generally as $P_1$ is a piezoelectric element having a pair of parallel electrode layers, such as silver coatings, 14 and 15 between which a layer containing first and second inorganic piezoelectric materials 11 and 12 in the form of powder are homogeneously dispersed in a matrix 13. The polarization directions of the two piezoelectric materials 11 and 12 are opposite to each other as schematically shown by the arrows.

Figure 2:
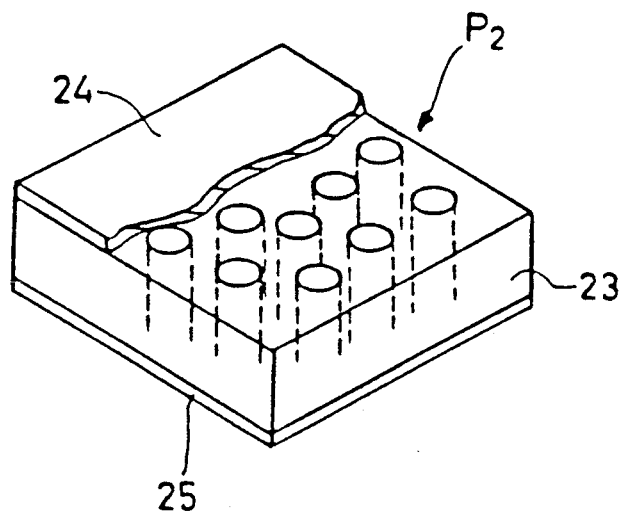
Figure 2:
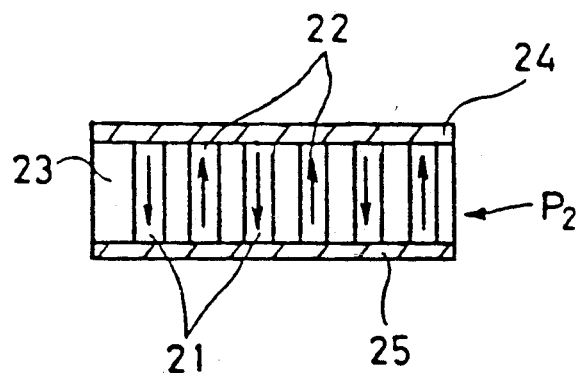

In the alternative embodiment shown in FIGS. 2(a) and 2(b), a plurality of first rods 21 formed of a first inorganic piezoelectric material and a plurality of second rods 22 formed of a second inorganic piezoelectric material are dispersed in a matrix 23 with the axes thereof being oriented in the direction perpendicular to electrodes 24 and 25 to form a piezoelectric element $P_2$.

Figure 3A:
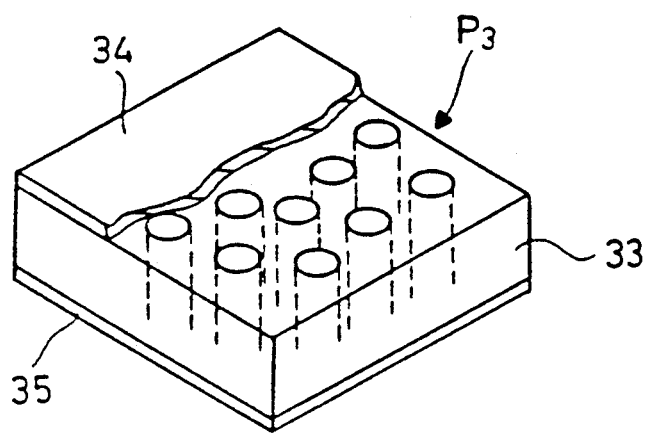
Figure 3B:
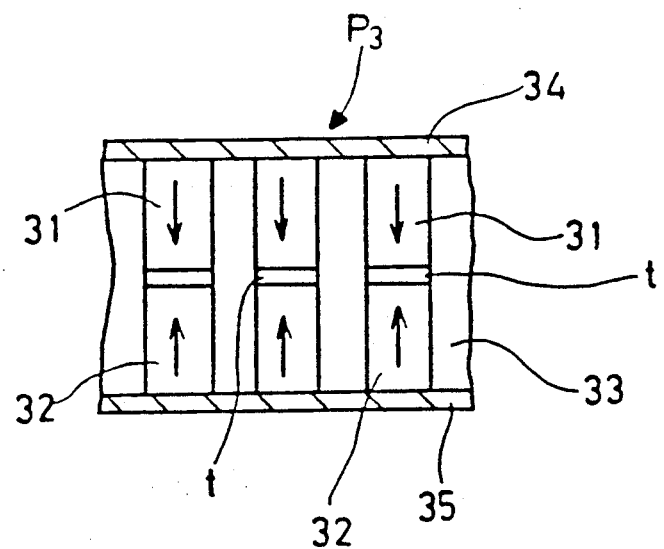

In the piezoelectric element $P_3$ shown in FIGS. 3(a) and 3(b), a plurality of rods are dispersed in a matrix 33 with the axes thereof being oriented in the direction perpendicular to electrodes 34 and 35. Each of the rods has an upper half 31 formed of a first inorganic piezoelectric material and a lower half 32 formed of a second inorganic piezoelectric material. If desired, a boundary layer t formed of a solid solution of the first and second inorganic piezoelectric materials may be provided between the upper and lower halves 31 and 32 of each of the rods.

Figure 4:
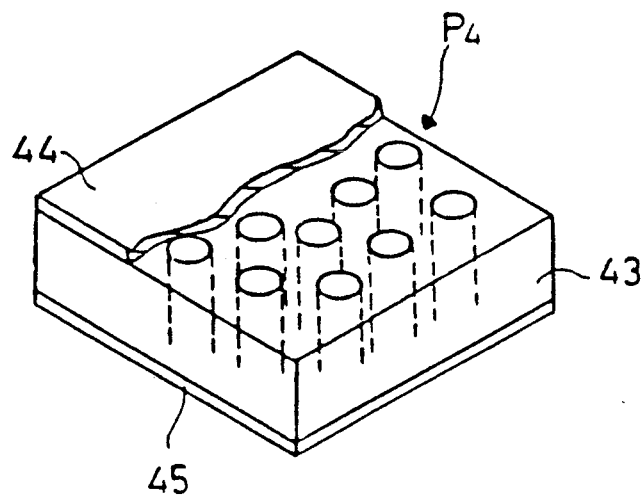
Figure 4:
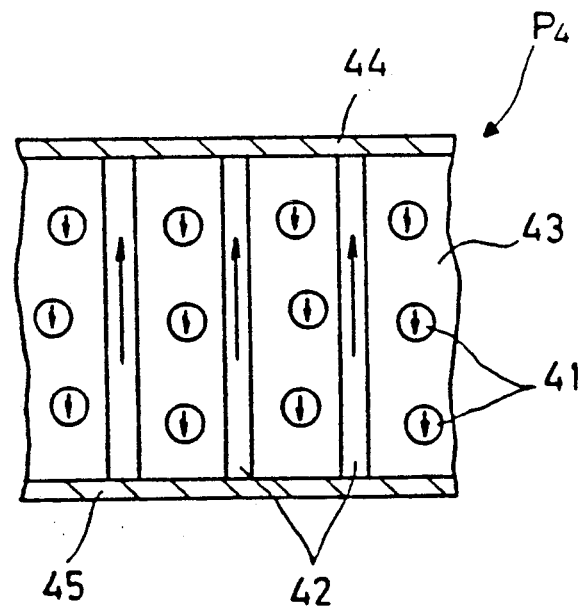

FIGS. 4(a) and 4(b) illustrate a further embodiment of piezoelectric element $P_4$, in which a plurality of rods 42 are dispersed in a matrix 43 with the axes thereof being oriented in the direction perpendicular to electrodes 44 and 45. Each of the rods 42 is formed of one of the first and second inorganic piezoelectric materials, preferably the second inorganic piezoelectric material. The other one 41 of the first and second inorganic piezoelectric materials, preferably the first inorganic piezoelectric material, is in the form of powder and is dispersed in the matrix 43.

Figure 5:
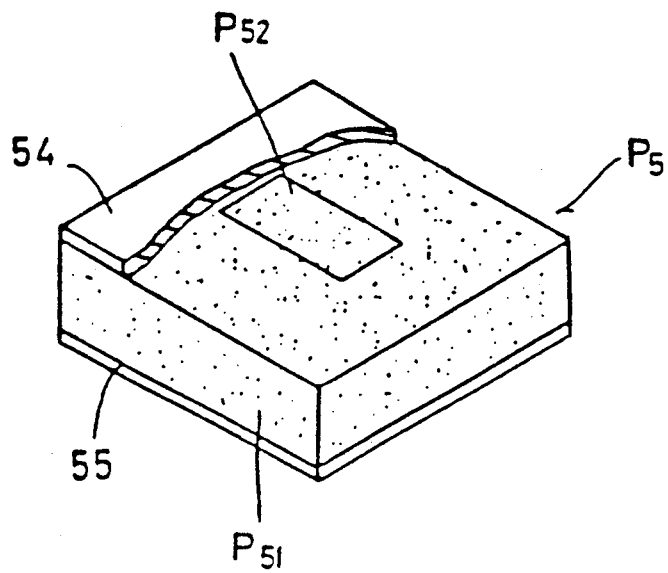
Figure 5:
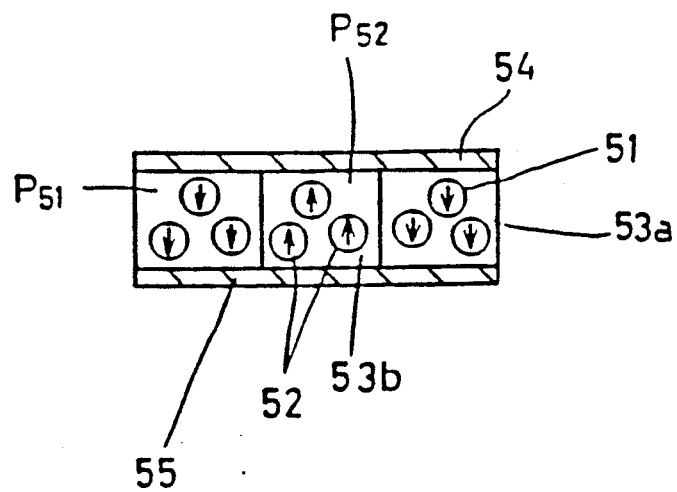

FIGS. 5(a) and 5(b) depict a further embodiment of the present invention. Designated as $P_{52}$ is a first layer including a matrix 53b and one of the first and second inorganic piezoelectric materials, preferably the second inorganic piezoelectric material 52, dispersed in the matrix 53b. The first layer $P_{52}$ is inserted into a bore formed in a center portion of a second matrix layer $P_{51}$ including a matrix 53a and the other one of the first and second inorganic piezoelectric materials, preferably the first inorganic piezoelectric material 51, dispersed in the matrix 53a. The assembly of the first and second layers $P_{52}$ and $P_{51}$ are sandwiched between a pair of electrodes 54 and 55 to form a piezoelectric element $P_5$.

Figure 6:
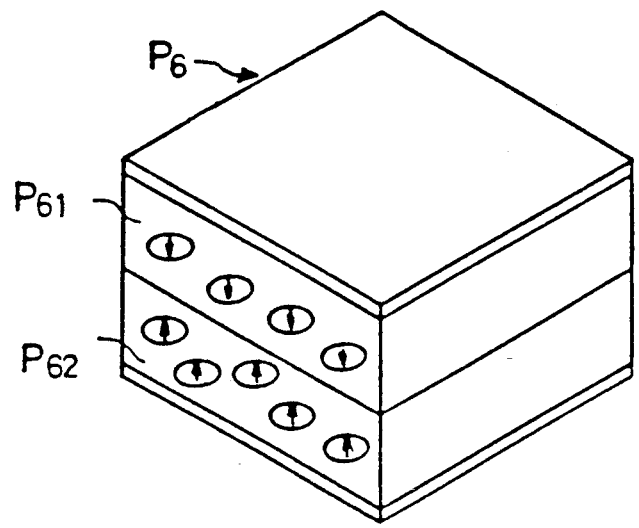
Figure 6:
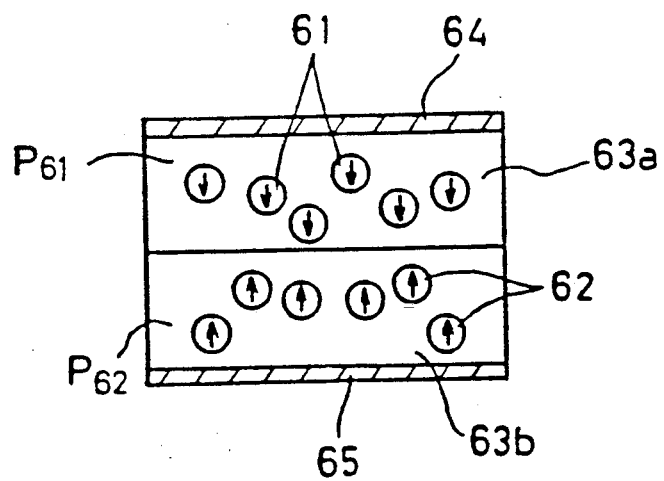

FIGS. 6(a) and 6(b) illustrate a further embodiment. Designated as $P_{61}$ is a first, upper layer including a matrix 63a and one of the first and second inorganic piezoelectric materials 61 dispersed in the matrix 63a. The first layer $P_{61}$ is laminated with a second, lower layer $P_{62}$ including a matrix 63b and the other one of the first and second inorganic piezoelectric materials 62 dispersed in the matrix 63b. The assembly of the first and second layers $P_{61}$ and $P_{62}$ are sandwiched by a pair of electrodes 64 and 65 to form a piezoelectric element $P_6$. in the above embodiments shown in FIGS. 1-6, there are established various couplings similar to 0-3 type coupling, 1-3 type coupling, etc. as suggested by R. E. Newhamm et al in Mat. Res. Bull. 13, 525-536

(1987). The first numeral of the two numeral indication represents the dimension of the inorganic piezoelectric material while the second numeral indicates the dimension of the material forming the matrix. The composite layers in the above embodiments shown in FIGS. 1 and 6 form 0-3 type coupling and exhibit excellent flexibility since the inorganic piezoelectric materials are not coupled in any direction of the first, second and third axes. The composite layers shown in FIGS. 2, 3 and 5 form 1-3 type coupling and are flexible in the directions of the first and second axes. The composite layer shown in FIG. 4 forms 1-3 type and 0-3 type couplings.

Figure 7:
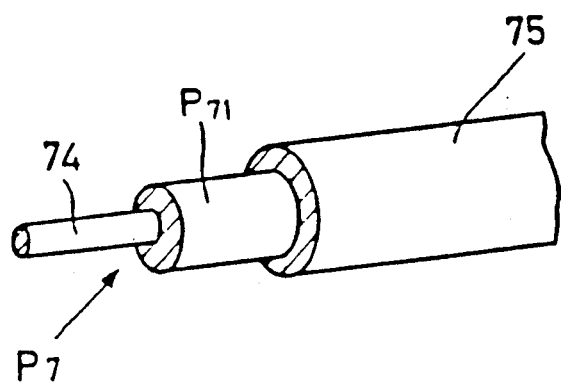
Figure 7:
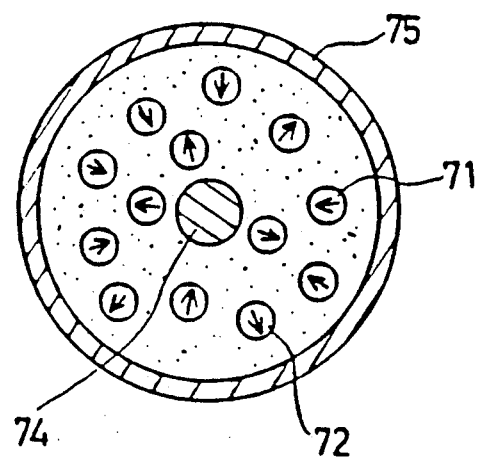

As shown in FIGS. 7(a) and 7(b), the piezoelectric element $P_7$ according to the present invention may be in the form of a cable, wherein a tubular layer $P_{71}$ containing first and second inorganic materials 71 and 72 is disposed between a core electrode 74 and a coaxial tubular electrode 75. The two piezoelectric materials 71 and 72 are polarized in opposite directions as shown by the arrows and are dispersed in a matrix which may be similar to those described previously. The piezoelectric layer $P_{71}$ forms 0-3 type coupling.

Figure 8:
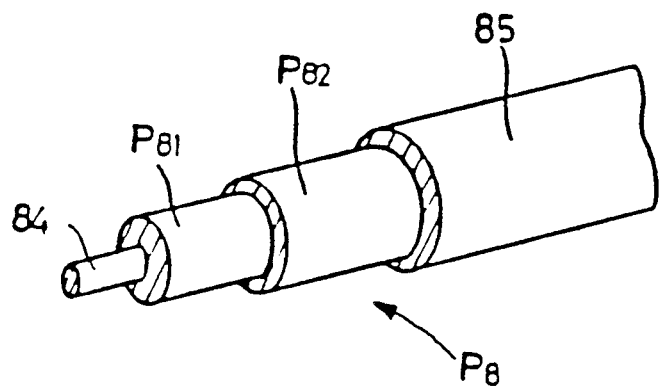
Figure 8:
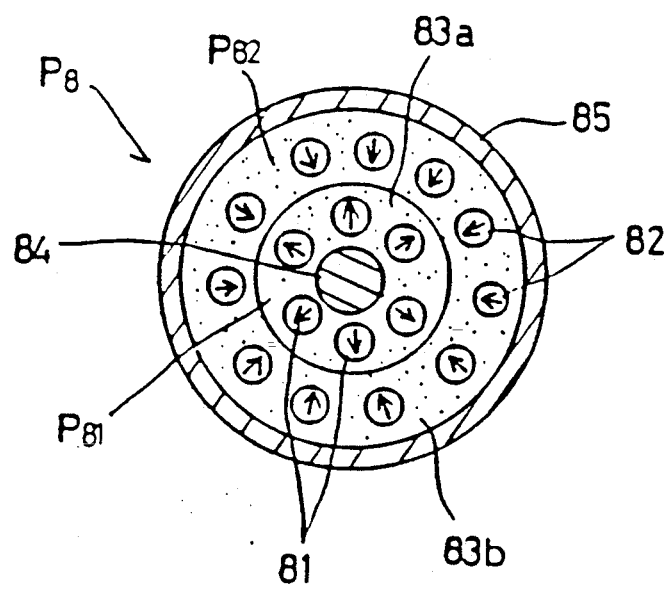

FIGS. 8(a) and 8(b) illustrate an embodiment of another piezoelectric element $P_8$ in the form of a cable. Designated as 84 is a core electrode which is surrounded by an inner tubular layer $P_{81}$ containing a matrix 83a and one of the first and second inorganic piezoelectric materials 81 dispersed dispersed in the matrix 83a. The inner layer $P_{81}$ is surrounded by an outer tubular layer $P_{82}$ containing a matrix 83b and the other one of the first and second inorganic piezoelectric materials 82 dispersed in the matrix 83b. The outer layer $P_{82}$ is surrounded by an outer tubular electrode 85 to form a piezoelectric element $P_8$. Each of the layers $P_{81}$ and $P_{82}$ forms 0-3 type coupling. The polarization directions of the two piezoelectric materials 81 and 82 are oriented in the radial direction and opposite to each other as schematically shown by the arrows.

Figure 9:
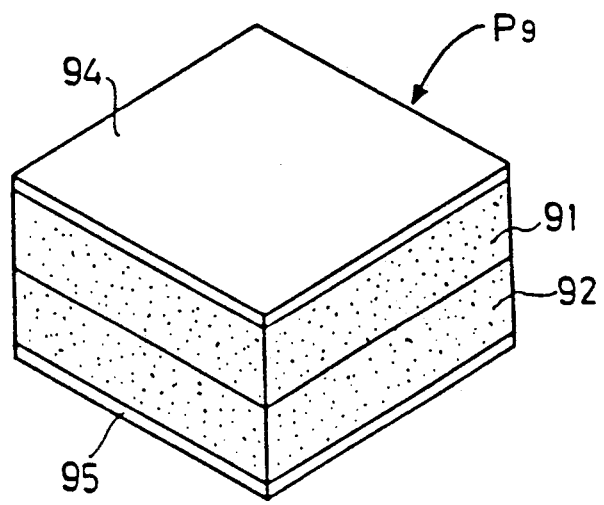
Figure 9:
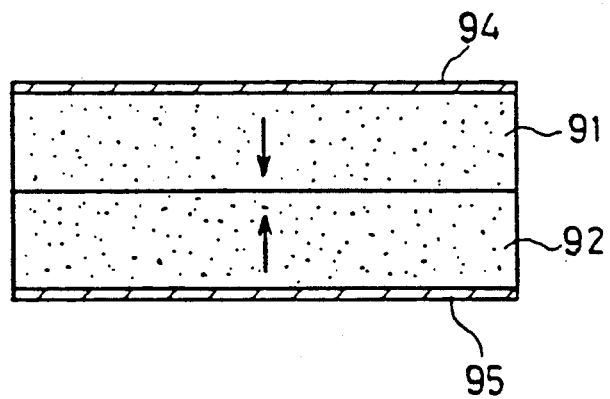

In the embodiment shown in FIGS. 9(a) and 9(b), a first, upper sheet 91 formed of a first inorganic piezoelectric material and a second, lower sheet 92 formed of a second inorganic piezoelectric material are laminated with each other and are sandwiched between a pair of electrodes 94 and 95 to form a piezoelectric element $P_9$. The both layers 91 and 92 are prepared by curing a layer of two green sheets of the first and second inorganic piezoelectric materials. The polarization directions of the two piezoelectric layers 91 and 92 are opposite to each other as shown by the arrows sheet.

Figure 10:
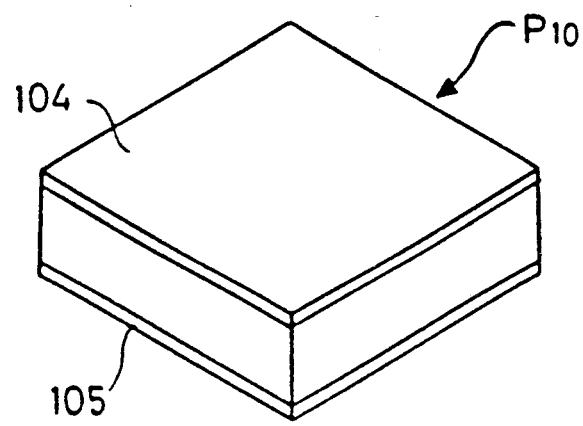
Figure 10:
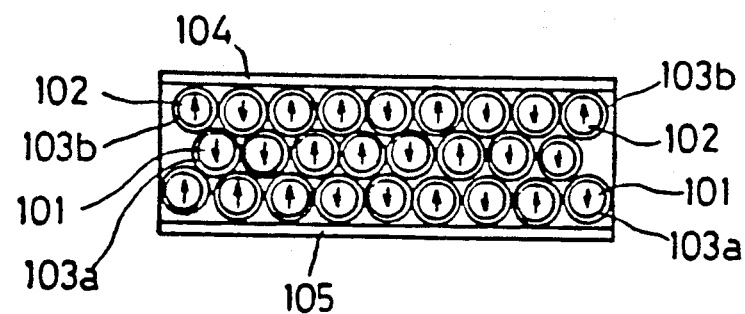

A piezoelectric element $P_{10}$ shown in FIGS. 10(a) and 10(b) includes a piezoelectric layer containing first and second inorganic piezoelectric materials 101 and 102 and sandwiched between a pair of electrodes 104 and 105. This layer is prepared as follows. First, fine particles of first and second inorganic piezoelectric materials 101 and 102 are each coated with an organic polymeric material or a glass. The coated powder is molded into a sheet by hot press at a temperature and a pressure sufficient to melt the coatings and to bind the particles of the piezoelectric materials together.

The piezoelectric element according to the present invention may be produced as follows. First, a layer containing two, first and second inorganic piezoelectric materials having different coercive forces from each other is formed by any known manner. A pair of electrodes are then fitted to the layer by, for example, application of a silver paint. A first, direct current voltage is then impressed between the electrodes to polarize the first and second inorganic piezoelectric materials in one direction (primary polarization treatment). Thereafter, a second, direct current voltage is impressed between the electrodes in the reverse direction to polarize the second inorganic piezoelectric material, whose coercive force is smaller than that of the first inorganic piezoelectric material, in the other direction, so that one of $d_{31}$, $d_{33}$ and $d_h$ of the composite body is substantially zero (secondary polarization treatment).

The following examples will further illustrate the present invention.

EXAMPLE 1

Figure 11:
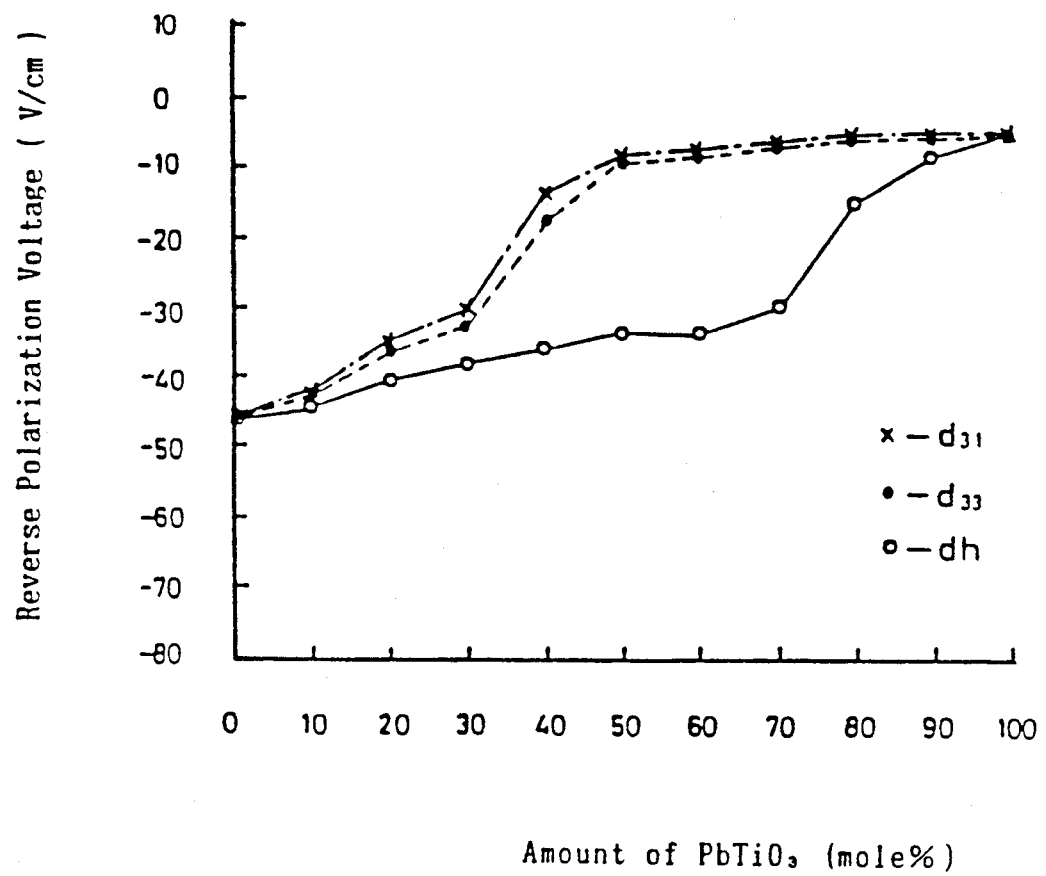
FIGS. 11-14 are graphs showing relationships between the reverse polarization voltage required for making each of $d_{31}$, $d_{33}$ and $d_h$ substantially zero and the molar ratio of $PbTi_3$ to $Pb(Ti, Zr)O_3$.

Quantities of (A) lead titanate powder ($d_{31} = -6.5 \times 10^{-12}$ C/N, $d_{33} = 54 \times 10^{-12}$ C/N, $d_h = 41 \times 10^{-12}$ C/N), (B) lead titanate zirconate powder ($d_{31} = -260 \times 10^{-12}$ C/N, $d_{33} = 570 \times 10^{-12}$ C/N, $d_h = 50 \times 10^{-12}$ C/N) and (C) a chloroprene rubber were mixed with each other and roll-pressed to form sheets having a thickness of 1 mm, a volume ratio of ((A)+(B))/(C) of 50:50 and molar ratios of (A)/(B) as shown in Table 1. Each of the sheets was punched to obtain a rectangular sheet of 20 mm × 25 mm. Each of the punched sheets was then cured at 170° C. for 20 minutes, followed by application of a silver paint onto both sides thereof to form a pair of electrodes. A voltage of 70 KV/cm was impressed between the electrodes at 20° C. in an oil to effect primary polarization. Then, reverse polarization voltages were applied at 20° C. for 30 minutes in the oil to determine the voltages required for making $d_{31}$, $d_{33}$ and $d_h$ substantially zero. These voltages were as shown in Table 1 and in FIG. 11.

TABLE 1

Polarization Voltage Required for Making $d_{31}$, $d_{33}$ and $d_h$ Substantially Zero
(Volume Ratio of (A + B)/C = 50:50)

| Molar Ratio | Polarization Voltage (V/cm) | | |
|---|---|---|---|
| of A:B | $d_{31} = 0$ | $d_{33} = 0$ | $d_h = 0$ |
| 0:100 | −46.36 | −46.31 | −46.38 |
| 10:90 | −41.89 | −42.78 | −44.43 |
| 20:80 | −34.65 | −36.58 | −40.86 |
| 30:70 | −30.18 | −32.53 | −38.34 |
| 40:60 | −13.48 | −17.68 | −36.11 |
| 50:50 | −8.05 | −9.31 | −33.56 |
| 60:40 | −7.35 | −8.23 | −34.16 |
| 70:30 | −6.26 | −6.85 | −30.00 |
| 80:20 | −5.38 | −5.77 | −15.00 |
| 90:10 | −5.00 | −5.21 | −8.23 |
| 100:0 | −5.05 | −5.03 | −4.73 |

EXAMPLE 2

Figure 12:
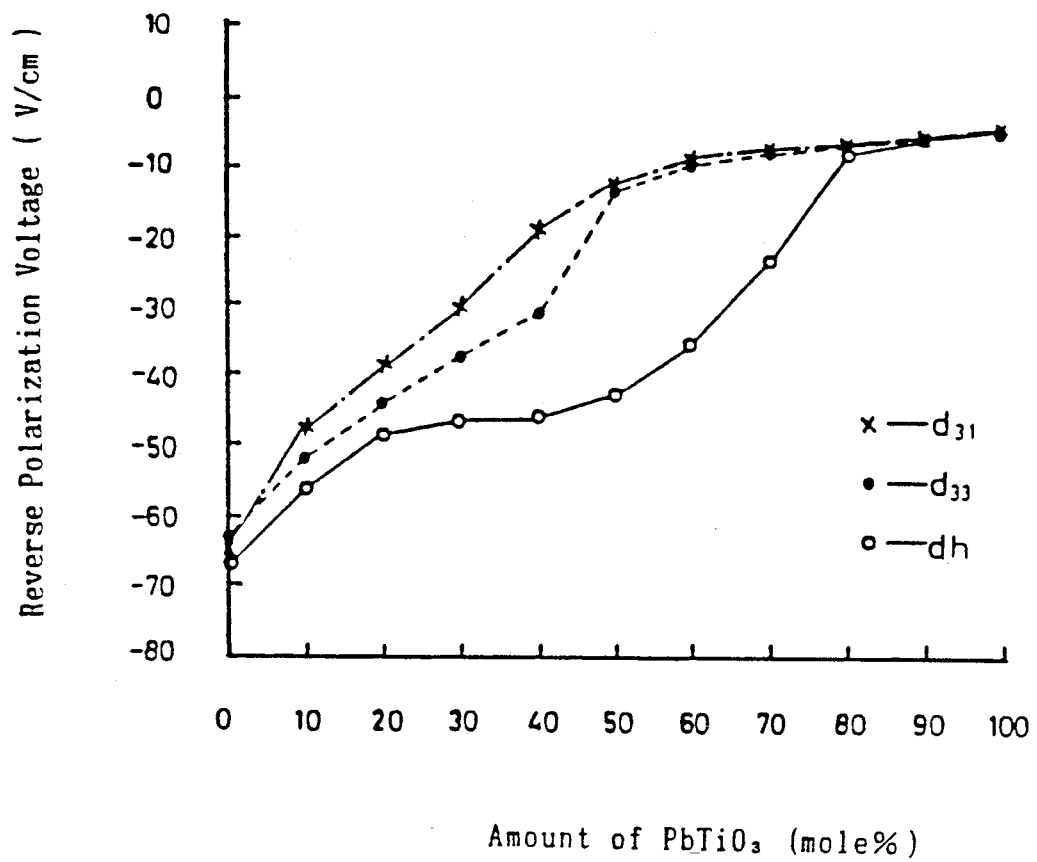

Example 1 was repeated in the same manner as described except that the volume ratio ((A)+(B))/(C) was changed to 60:40. The results are shown in Table 2 and FIG. 12.

TABLE 2

Polarization Voltage Required for Making $d_{31}$, $d_{33}$ and $d_h$ Substantially Zero
(Volume Ratio of (A + B)/C = 60:40)

| Molar Ratio | Polarization Voltage (V/cm) | | |
|---|---|---|---|
| of A:B | $d_{31} = 0$ | $d_{33} = 0$ | $d_h = 0$ |
| 0:100 | −64.46 | −62.89 | −66.58 |
| 10:90 | −47.48 | −51.61 | −55.69 |
| 20:80 | −38.27 | −44.18 | −48.05 |
| 30:70 | −30.40 | −37.00 | −46.00 |
| 40:60 | −19.07 | −31.25 | −45.86 |
| 50:50 | −12.34 | −13.39 | −42.76 |
| 60:40 | −8.53 | −9.64 | −35.49 |
| 70:30 | −7.21 | −7.81 | −23.25 |

TABLE 2-continued

Polarization Voltage Required for Making
$d_{31}$, $d_{33}$ and $d_h$ Substantially Zero
(Volume Ratio of (A + B)/C = 60:40)

| Molar Ratio | Polarization Voltage (V/cm) | | |
|---|---|---|---|
| of A:B | $d_{31} = 0$ | $d_{33} = 0$ | $d_h = 0$ |
| 80:20 | −6.68 | −6.84 | −8.00 |
| 90:10 | −5.67 | −5.68 | −5.81 |
| 100:0 | −5.25 | −5.15 | −4.38 |

EXAMPLE 3

Figure 13:
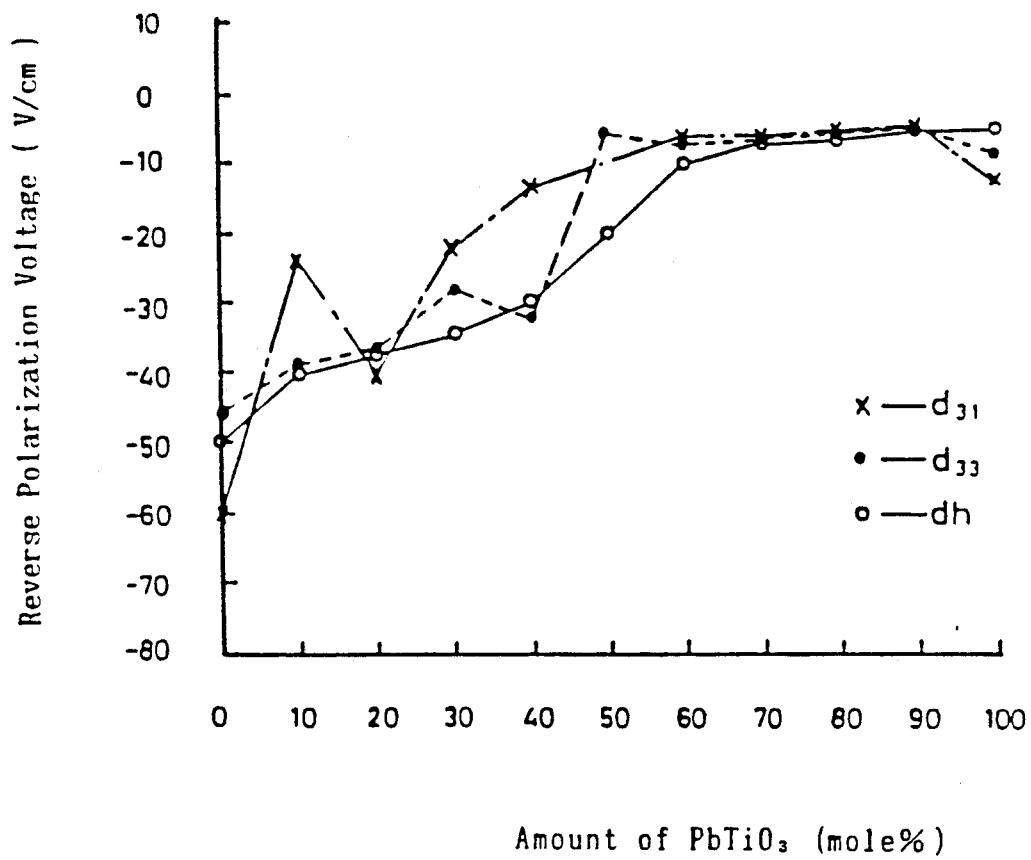

Example 1 was repeated in the same manner as described except that the volume ratio ((A)+(B))/(C) was changed to 30:30. The results are shown in Table 3 and FIG. 13.

TABLE 3

Polarization Voltage Required for Making
$d_{31}$, $d_{33}$ and $d_h$ Substantially Zero
(Volume Ratio of (A + B)/C = 70:30)

| Molar Ratio | Polarization Voltage (V/cm) | | |
|---|---|---|---|
| of A:B | $d_{31} = 0$ | $d_{33} = 0$ | $d_h = 0$ |
| 0:100 | −60.00 | −45.66 | −50.00 |
| 10:90 | −24.28 | −38.64 | −40.00 |
| 20:80 | −40.00 | −36.51 | −37.50 |
| 30:70 | −22.36 | −28.51 | −34.39 |
| 40:60 | −13.68 | −32.32 | −30.00 |
| 50:50 | — | −5.85 | −20.00 |
| 60:40 | −6.17 | −7.49 | −10.00 |
| 70:30 | −6.13 | −6.58 | −7.30 |
| 80:20 | −5.27 | −5.64 | −6.34 |
| 90:10 | −4.50 | −4.83 | −5.27 |
| 100:0 | −12.30 | −8.79 | −4.67 |

EXAMPLE 4

Figure 14:
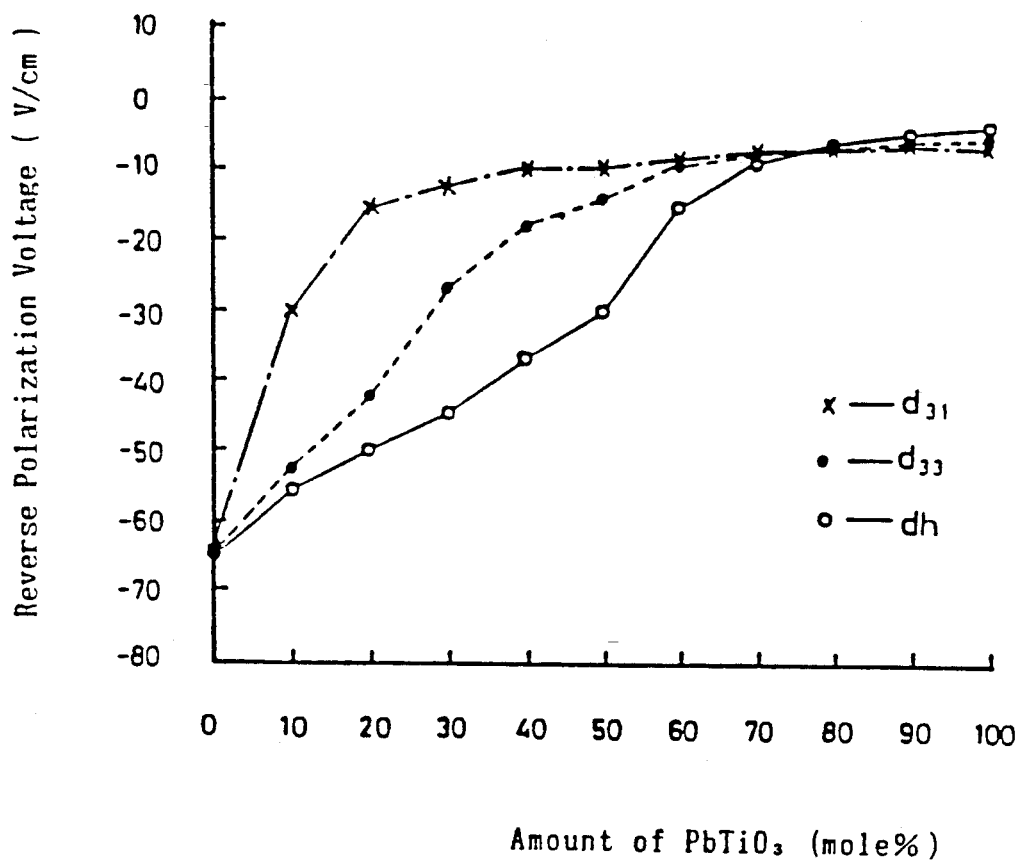

Example 1 was repeated in the same manner as described except that the volume ratio ((A)+(B))/(C) was changed to 75:25. The results are shown in Table 4 and FIG. 14.

TABLE 4

Polarization Voltage Required for Making
$d_{31}$, $d_{33}$ and $d_h$ Substantially Zero
(Volume Ratio of (A + B)/C = 75:25)

| Molar Ratio | Polarization Voltage (V/cm) | | |
|---|---|---|---|
| of A:B | $d_{31} = 0$ | $d_{33} = 0$ | $d_h = 0$ |
| 0:100 | −65.00 | −64.63 | −63.75 |
| 10:90 | −55.66 | −52.15 | −30.00 |
| 20:80 | −50.00 | −41.99 | −15.29 |
| 30:70 | −44.64 | −26.66 | −12.26 |
| 40:60 | −36.58 | −18.00 | −9.65 |
| 50:50 | −30.00 | −13.89 | −9.75 |
| 60:40 | −15.50 | −9.29 | −8.31 |
| 70:30 | −8.83 | −7.72 | −7.36 |
| 80:20 | −6.47 | −7.15 | −7.38 |
| 90:10 | −4.76 | −6.21 | −6.48 |
| 100:0 | −3.64 | −5.67 | −6.76 |

EXAMPLE 5

Figure 15:
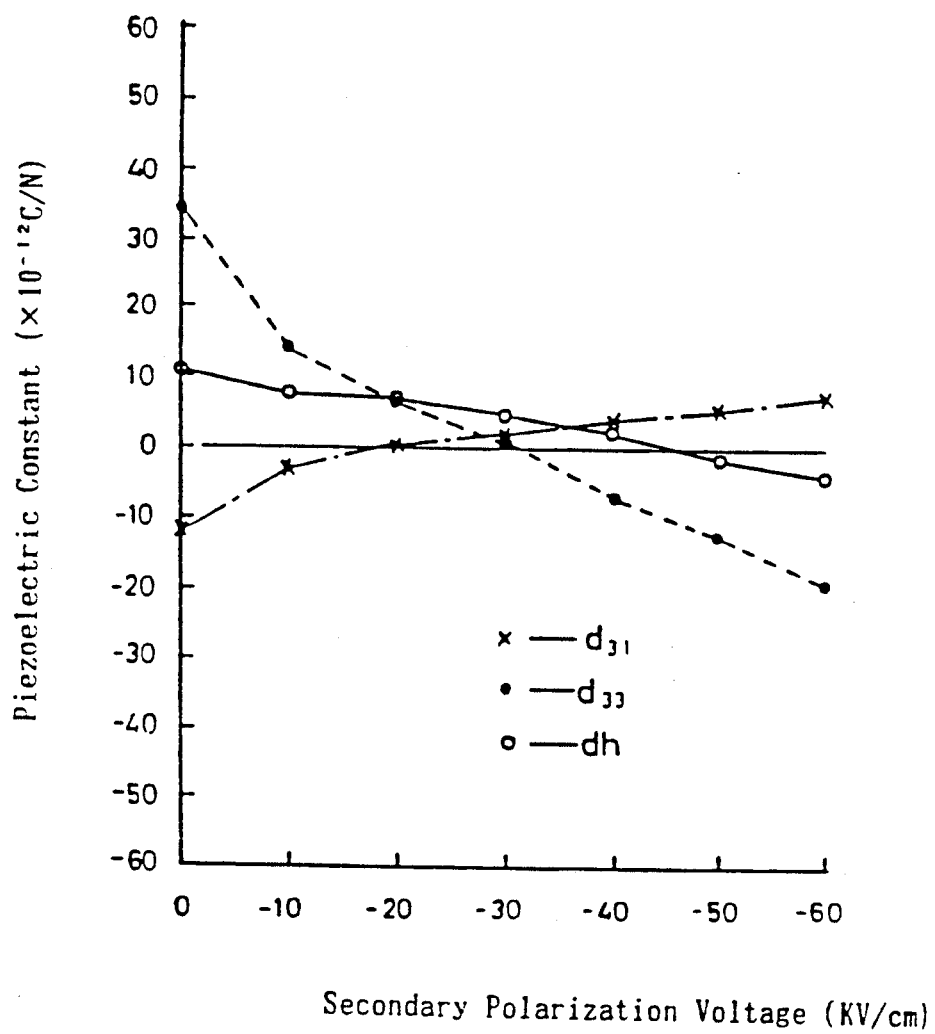
FIG. 15 is a graph showing a relationship between each of $d_{31}$, $d_{33}$ and $d_h$ and the reverse polarization voltage.

Using the piezoelectric element obtained in Example 2 and having a volume ratio ((A)+(B))/(C) of 60:40 and a molar ratio (A):(B) of 40:60, the reverse polarization voltage was changed from 0 to −60 KV/cm and $d_{31}$, $d_{33}$ and $d_h$ were measured at those voltages. The results are shown in FIG. 15, from which it is seen that $d_{31}$, $d_{33}$ and $d_h$ are zero at voltages of −19.07, −31.25 and −45.86, respectively.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. A method for producing a piezoelectric element, comprising the steps of:
   providing a pair of electrodes,
   disposing between said electrodes a piezoelectric layer containing first and second inorganic piezoelectric materials having different coercive forces;
   impressing a first direct current voltage between said pair of electrodes to polarize said first and second inorganic piezoelectric materials in one direction; and
   then impressing a second, direct current voltage between said pair of electrodes to polarize the one of said first and second inorganic piezoelectric material whose coercive force is smaller than that of the other, in a direction opposite to said one direction so that one of the $d_{31}$, $d_{33}$ and $d_h$ properties of said element is made substantially zero.

2. The method according to claim 1, wherein said first inorganic piezoelectric material is selected from the group consisting of $PbTio_3$, $PbNb_2O_6$ and $PbTa_2O_6$ and said second inorganic piezoelectric material is selected from the group consisting of $BaTio_3$ and $PbTi_xZr_{1-x}O_3$ where x is a number of greater than 0 but not greater than 1.

3. The method according to claim 1, wherein the step of providing the pair of electrodes comprises providing a core electrode and a tubular electrode coaxial with and surrounding said core electrode,
   and said step of disposing said layer comprises interposing a tube formed of said two inorganic piezoelectric materials between said core electrode and said tubular electrode to form a cable.

4. The method according to claim 3, wherein said step of providing said pair of electrodes comprises forming said electrodes as plates between which said layer of inorganic piezoelectric materials is interposed to form a sheet.

5. The method according to claim 1 wherein said step of disposing said layer further comprises forming a matrix of a material selected from the group consisting of organic polymeric materials, low melting point glass and low temperature-sintered ceramics with said first and second inorganic piezoelectric materials contained in said matrix and interposing said matrix between said electrodes.

6. The method according to claim 5, wherein said first and second inorganic piezoelectric material are in the form of powder and homogeneously dispersed in said matrix.

7. The method according to claim 5, wherein said step of disposing further comprises providing a plurality of first rods formed of said first inorganic piezoelectric material and a plurality of second rods formed of said second inorganic piezoelectric material, and disposing said first and second rods in said matrix with the axes thereof oriented in a direction perpendicular to said electrodes.

8. The method according to claim 5, further comprising the step of forming a plurality of rods with an upper half of said first inorganic piezoelectric material and a lower half of said second inorganic piezoelectric material, and said disposing step comprises disposing said plurality of rods in said matrix with the axes thereof being oriented in the direction perpendicular to said electrodes.

9. The method according to claim 8, further comprising the step of providing each of said rods with a boundary layer between said upper and lower halves which is formed of a solid solution of said first and second inorganic piezoelectric materials.

10. The method according to claim 5, further comprising the step of forming a first plurality of rods of one of said first and second inorganic piezoelectric materials and a second plurality of rods of the other of said first and second inorganic piezoelectric materials being in the form of powder and dispersed in said matrix and the step of disposing said layer further comprises disposing said first and second plurality of rods in said matrix with the axes thereof oriented in a direction perpendicular to said electrodes.

11. The method according to claim 5, wherein the step of forming said matrix comprises forming a first center matrix layer in which one of said first and second inorganic piezoelectric materials is dispersed, and a second matrix layer surrounding said first matrix layer containing the other one of said first and second inorganic piezoelectric materials.

12. The method according to claim 5 wherein the step of forming said matrix comprises forming a first, upper matrix layer in which said first inorganic piezoelectric material is dispersed and disposing said upper matrix layer in parallel with said electrodes, and a second, lower matrix layer in which said second inorganic piezoelectric material is dispersed, and laminating said second layer to said first matrix layer.

13. The method according to claim 3 wherein said step of disposing said layer comprises forming a matrix of a material selected from the group consisting of organic polymeric materials, low melting point glass and low temperature-sintered ceramics, said first and second inorganic piezoelectric materials being contained in said matrix.

14. The method according to claim 13, wherein said first and second inorganic piezoelectric materials are in the form of powder and homogeneously dispersed in said matrix.

15. The method according to claim 14, wherein the step of forming said matrix comprises forming a first, inner tubular matrix layer in which one of said first and second inorganic piezoelectric materials is dispersed, and a second, outer tubular matrix layer in which the other one of said first and second inorganic piezoelectric materials is dispersed and laminating said second matrix layer to said first matrix layer.

* * * * *